SEMICONDUCTOR DEVICE AND A METHOD FOR FABRICATING THE SAME

Filed July 15, 1971

INVENTORS

AKIO HAYASAKA and KENJI TANIGUCHI

BY

Craig, Antonelli & Hill

ATTORNEYS

United States Patent Office 3,795,553

Patented Mar. 5, 1974

3,795,553

SEMICONDUCTOR DEVICE AND A METHOD FOR FABRICATING THE SAME

Akio Hayasaka, Kokubunji, and Kenji Taniguchi, Kodaira, Japan, assignors to Hitachi, Ltd., Tokyo, Japan Filed July 15, 1971, Ser. No. 162,859
Claims priority, application Japan, July 15, 1970, 45/61,335
Int. Cl. H01l 7/34
U.S. Cl. 148—187 8 Claims

ABSTRACT OF THE DISCLOSURE

A transistor having a narrow emitter width is fabricated by forming a circular shaped first mask on an n-type Si layer, diffusing B into the Si layer, thereby forming the first diffusing region, forming $SiO_2$ on the exposed surface of the Si layer, removing the first mask, diffusing B whose impurity concentration is lower than that of the first diffused region utilizing the $SiO_2$ as a second mask, thereby forming the second diffused region, and diffusing P into the Si layer utilizing the second mask, thereby forming the third diffused region. The Si layer, the second diffused region, and the third diffused region are operated as the collector, the base, and the emitter of the transistor, respectively.

Figure 1:
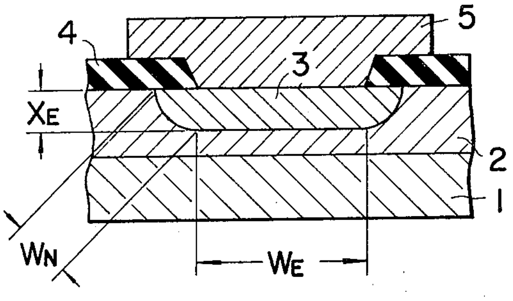

This invention relates to a semiconductor device and to a method for fabricating the same, and more particularly to a high frequency transistor having a narrow emitter width and a small non-working part of the emitter as well as to a method for fabricating the same.

For obtaining high frequency characteristics of semiconductor devices, such as transistors, semiconductor integrated circuit devices, it is most effective to minify the semiconductor devices.

Generally, a conventional minified semiconductor device, for example, a transistor comprises a semiconductor substrate which acts as a collector, a semiconductor layer having an opposite conductivity type to that of the substrate, epitaxially grown on the substrate, which acts as a base, an insulating layer disposed on the epitaxial growth layer having an aperture including therein a surface portion of the epitaxial growth layer, and a semiconductor region having an opposite conductivity type to that of the epitaxial growth layer formed by diffusing impurities through the aperture of the insulating layer, which acts as an emitter.

This semiconductor device, however, has some defects, such as the limitation of high frequency operation and a lowering of the current-amplification factor.

The high frequency operation is affected seriously by the base resistance which depends on the emitter width limited, in the above mentioned semiconductor device, by the size of an aperture for making the emitter region. The diameter of the aperture cannot be made so as to have less than about 1$\mu$, because of the optical limitation of the photo-mask for making the aperture. Therefore, the base resistance is limited, and the high frequency operation is limited.

The lowering of the current-amplification factor is caused by a back-injection of carriers which is in proportion to the size of the non-working part of the emitter. The size of the non-working part of the emitter of the above-mentioned semiconductor device is not so small, therefore, the lowering of the current-amplification factor is unavoidable.

For reducing the emitter width to increase the high frequency operation, conventionally, a semiconductor device, for example, a transistor comprising a semiconductor substrate which acts as a collector, a buried region disposed within the substrate having an opposite conductivity type to that of the substrate and having low resistivity, an insulating layer disposed on the substrate having an aperture, a semiconductor layer having the same conductivity type as the buried region fabricated by diffusing the impurities utilizing the aperture so that a part of the layer contacts with the buried region, which acts as a base, and a semiconductor region having an opposite conductivity type to that of the base fabricated by diffusing the impurities into the semiconductor region utilizing the aperture is being proposed.

In this device, only the part which does not contact with the buried region operates as the base. Since the base width can be controlled by the diffusions of the base and the emitter, respectively, the emitter width is able to have a value less than the emitter width of the aforementioned semiconductor device. Therefore, this semiconductor device can respond to higher frequencies than that of the aforementioned semiconductor device.

In this semiconductor device, however, since the non-working part of the emitter is larger than that of the emitter, the back-injection occurs to a greater extent than in the aforementioned semiconductor device. Moreover, for preventing the injection of the carriers from the emitter to the buried region, the impurity concentration of the buried region should be increased. Therefore, a junction capacity between the emitter and the buried region is formed, and the high-switching operation becomes difficult.

An object of this invention, therefore, is to provide a semiconductor device having high frequency operating characteristics by avoiding the above-mentioned defects of the conventional semiconductor devices, and a method of making the same.

It is another object of this invention to provide a semiconductor device having a narrow emitter width, and a method of making the same.

It is still another object of this invention to provide a semiconductor device having little back-injection of the carriers, and a method of making the same.

Figure 2:
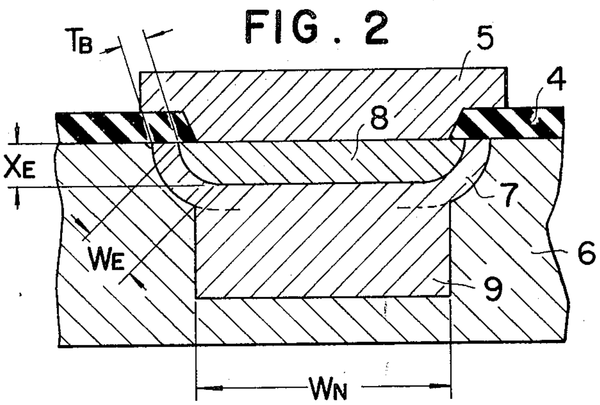
Figure 3A:
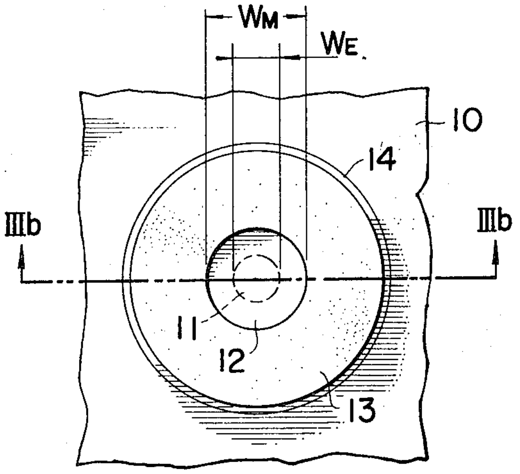
Figure 3B:
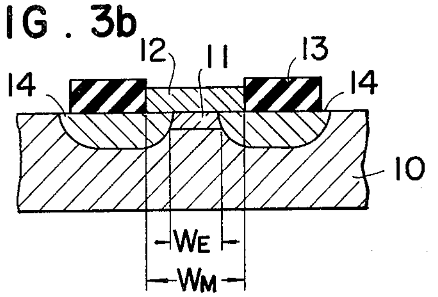

Additional objects and advantages of this invention will become apparent from the following description beginning with a brief explanation of a conventional semiconductor device, when taken in conjunction with the accompanying drawings, wherein:

FIGS. 1 and 2 are sectional views of conventional semiconductor devices;

FIG. 3*a* is a plan view of an embodiment of this invention;

FIG. 3*b* is a sectional view of the embodiment of this invention cut along line III*b*—III*b* in FIG. 3*a*; and FIGS. 4*a* to 4*e* are explanatory views of a process for fabricating a semiconductor device of this invention.

Referring now to FIG. 1 showing a sectional view of a conventional transistor, this transistor comprises a collector layer 1, for example, of P-conductivity type, a base layer 2 of N-type disposed on the collector layer 1, and an emitter region 3 of P-type disposed within the base layer 2. The emitter region 3 is formed by the diffusion method utilizing an aperture in an $SiO_2$ layer 4. The diameter of the aperture in the $SiO_2$ layer 4 cannot be made so as to have less than about 1$\mu$, because of the optical limitation of the photo-mask for making the aperture, hence, the emitter width $W_E$ cannot be made so as to have less than about 1$\mu$. Therefore, it is difficult to reduce the base resistance so as to have less than a certain value. This difficulty is one of the causes of preventing the high frequency operation of transistors.

Moreover, since the non-working parts $W_N$ of the emitter 3 cannot be made small, the quantity of carriers which is back-injected from the base 2 into the emitter 3 through the non-working parts $W_N$ is increased, and therefore the current-amplification factor of the transistor is lowered. For making the non-working parts $W_N$ of the emitter 2 small and reducing the quantity of the back-injection carriers, the thickness $X_E$ of the emitter 2 should be thin. In the high frequency transistor in general use, the lowering of the current-amplification factor is being prevented by making the thickness of the emitter thin.

There are, however, practical limitations for making the thickness of the emitter relatively quite thin. When the thickness $X_E$ of the emitter 3 is made very thin, the distance between a metal electrode 5 disposed on the emitter 3 and the base 2 becomes very short, hence, it may happen easily that a short-circuit will occur between the electrode 5, and the base 2, and a lowering of the breakdown voltage of the transistor will be caused thereby. Moreover, aluminum as the metal electrode 5 is fabricated on the emitter 3 generally under a heat treatment at a temperature of over 260° C. By this treatment aluminum and the semiconductor material which composes the emitter 3 are alloyed, and this alloy sometimes reaches the base 2 across the emitter 3 since the thickness $X_E$ of the emitter 3 is very thin, hence the short-circuit occurs easily.

FIG. 2 shows a sectional view of another conventional transistor which is capable to control the emitter width $W_E$ at a predetermined value. This transistor comprises a collector layer 6, for example, of P-conductivity type, a buried region 9 of N-type disposed within the collector layer 6, and $SiO_2$ layer 4 disposed on the collector layer 6 having an aperture, a base region 7 of N-type disposed in the collector layer 6 and fabricated by diffusing the impurities into the collector layer 6 utilizing the aperture so that a part of the base region 7 contacts with the buried region 9, and an emitter region 8 of P-type disposed in the base region 7 and fabricated by diffusing the impurities into the base region 7 utilizing the aperture.

In this device, since only the part which does not contact with the buried region operates as the base, and the base width $T_B$ and the emitter width $W_E$ are able to be controlled by the base diffusion and the emitter diffusion, the emitter width $W_E$ is controlled so as to be less than $1\mu$.

As is evident from FIG. 2, however, in the transistor having such structure, the non-working part $W_N$ is too large compared with the working part $W_E$. Therefore, the back-injection occurs to a great extent, and the current-amplification factor is lowered.

Moreover, for preventing the injection of the carriers from the emitter 8 to the buried region 9, the impurity concentration of the buried region should be increased, hence, an injection capacity between the emitter and the buried region is formed, and the high-switching operation becomes difficult.

Besides, since the working parts of the emitter 8 are near the surface of the transistor, they are easily influenced from the surface. For example, a part of base 7 of N-type is converted into P-type by an active material, such as sodium and potassium included in the $SiO_2$ layer 4, and a leakage current flows near the surface through the converted part of the base 2.

The objects of this invention as described above are accomplished by a semiconductor device comprising a semiconductor layer having a first conductivity type, a first semiconductor region having a second conductivity type opposite to the first conductivity type, disposed in the semiconductor layer so as to encircle a desired portion, a second semiconductor region having a lower impurity concentration of the second conductivity type than that of the first semiconductor region, disposed within the desired portion, whose side surface is closely surrounded by the first semiconductor region and one surface of which is adjacent to the semiconductor layer, forming a P-N junction therewith, and a third semiconductor region having the first conductivity type disposed on the entire surface of the second semiconductor region, which is opposite to the surface adjacent to the semiconductor layer, forming another P-N junction therewith.

This semiconductor device is formed by utilizing mainly a selective diffusion method and a self-alignment method.

Referring now to FIGS. 3*a* and 3*b*, FIG. 3*a* is a plan view of an embodiment of this invention and FIG. 3*b* is a sectional view of the embodiment cut along line III*b*—III*b* in FIG. 3*a*.

In FIGS. 3*a* and 3*b*, numerals 10, 11, 12, 13 and 14 depict a semiconductor layer, a second semiconductor region, a third semiconductor region, an insulating layer and a first semiconductor region, respectively. When the semiconductor layer 10 is of P-type, semiconductor regions 11, 12 and 14 are N-type, P-type and $N^+$-type respectively. The impurity concentration of the first semi-conductor region 14 must be higher than that of the second semiconductor region 11. In this device, the semiconductor layer 10, the second semiconductor region 11 and the third semiconductor region 12 can be utilized as a collector, a base and an emitter, respectively.

More particularly, the semiconductor device of this invention has such a construction that the base 11 is disposed right under the emitter 12, is in close contact with the emitter, and is laterally limited by a first semiconductor region 14. Therefore, the emiter width $W_E$, which is the working part of the emitter, can be controlled so as to have less than the diameter $W_M$ of an aperture of the insulating layer 13, which is limited by the optical limitation of the photo-mask.

Since the emitter width $W_E$ of this invention is small and is controlled by controlling the temperature, the time, the impurity concentration etc. of the step for fabricating the first semiconductor region 14, the semiconductor device of this invention has such a characteristic that its operating frequency is higher than that of the conventional semiconductor device. Moreover, since the non-working parts of the emitter in this invention are only the parts contacting with the first semiconductor region 14 and are small, the quantity of carriers back-injected from the base is very small compared with the conventional semiconductor device.

In the FIGS. 3*a* and 3*b*, while the second semiconductor region 11, the third semiconductor region 12· the insulating layer 13 and the first semiconductor region 14 are disposed concentrically, it is to be understood that they may also be disposed in any other desired shape, such as in a rectangle, without departing from the spirit of the present invention.

FIGS. 4*a* to 4*e* are explanatory views of a process for fabricating a semiconductor device of this invention.

Figure 4A:
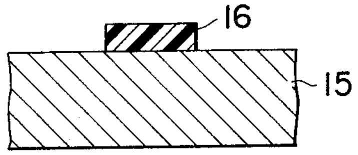
Figure 4B:
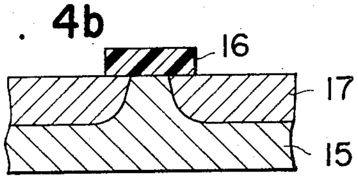
Figure 4C:
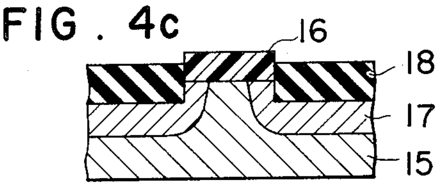

First, a first mask 16 is formed on a surface of a semiconductor layer 15 such as an N-type Si layer by the conventional method of the chemical vapor deposition method (FIG. 4*a*). For example, the first mask 16 is formed by depositing $Si_3N_4$ on the entire surface of the semiconductor layer 15, and then etching $Si_3N_4$ by the photo-etching method whereby a desired portion remains. Then, a large amount of impurities of P-type, such as B, are diffused into the surface of the semiconductor layer 15 thereby forming a first semiconductor region 17. At this time, though the impurities are not diffused through the first mask 16 (FIG. 4*b*). After this step, the diffused sur-15 covered with the first mask 16, since the impurities diffuse toward the lateral direction, the first semiconductor region 17 invades or diffuses slightly under the first mask 16 (FIG. 4b). After this step, the diffused surface of the semiconductor layer 15 which is not covered with the first mask 16 is oxidized by heating the semiconductor surface in an atmosphere of oxygen or air thereby forming the $SiO_2$ layer 18 (FIG. 4*c*).

Figure 4D:
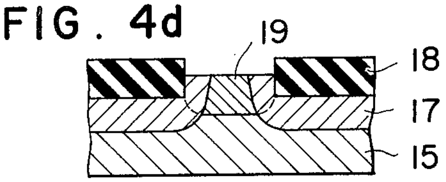

The first mask 16 is hten etched, and impurities of P-type, such as B, are diffused into the semiconductor layer by utilizing the $SiO_2$ layer 18 as a second mask thereby forming a second semiconductor region 19 (FIG. 4*d*). At this time, attention should be directed to the fact that the impurity concentration of the first semiconducor region 17 must be higher than that of the second semiconductor region 19. By this step, the side surface of the second semiconductor region 19 becomes closely surrounded by the first semiconductor region 17 and also one surface of the second semiconductor region 17 is adjacent to the semiconductor layer 15, forming a P-N junction therewith.

Figure 4E:
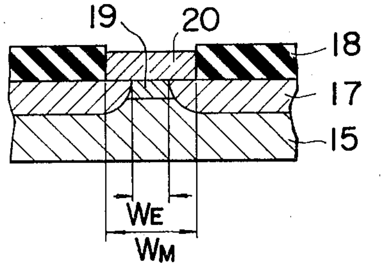

After that, impurities of N-type, such as P or As, are diffused into the second semiconductor region 19 utilizing the $SiO_2$ layer 18 as the second mask, thereby forming a third semiconductor region 20 (FIG. 4*e*). By means of the step, the third semiconductor region 20 comes to cover the entire surface of the second semiconductor region 19, which is opposite to the surface adjacent to the semiconductor layer 15, forming another P-N junction therewith.

The semiconductor device formed by the above steps acts as a transistor when the semiconductor layer 15, the second semiconductor region 19 and the third semiconductor region 20 are utilized as the collector, the base and the emitter, respectively.

In the transistor of FIG. 4*e*, the working part of the third semiconductor region 20 (the emitter) is the width $W_E$ of the emitter contacting the second semiconductor region 19 (the base). Though it is difficult to make the diameter af the aperture of the mask 18 less than 1$\mu$, as stated before, in this invention, as is apparent from FIG. 4*e*, it is possible to realize an emitter width $W_E$ having a diameter less than that of the mask $W_M$. Namely, it is possible to make the emitter width at the desired value by controlling the diffusion length of the impurities in forming the first semiconductor region 17.

Though the back-injection of the carriers occurs at the non-working part of the emitter, in this invention, the non-working part of the emitter is only the part which contacts with the first semiconductor region 17. Since the first semiconductor region 17 is a part which does not act as a part of the transistor, there is no possibility of the back injection at the non-working part of this invention.

While the preferred embodiments of the present invention have been described above by way of example, it will be understood that the present invention is in no way limited to such specific embodiments and many changes and modifications may be made therein without departing from the spirit of the present invention.

We claim:

1. A method for fabricating a semiconductor device comprising the steps of:

preparing a semiconductor layer of a first conductivity type;

forming a first mask on a surface of a desired portion of the semiconductor layer;

diffusing impurities of a second conductivity type opposite to the first conductivity type into the semiconductor layer from the surface of the semiconductor layer thereby forming a semiconductor region surrounding the desired portion;

forming an insulating layer on the surface of the semiconductor layer;

etching the first mask thereby exposing the surface of the semiconductor layer uncovered by the insulating layer;

diffusing impurities of the second conductivity type into the surface of the semiconductor layer utilizing the insulating layer as a second mask so that this diffused layer has an impurity concentration of less than that of the semiconductor region; and diffusing impurities of the first conductivity type into the diffused layer.

2. A method for fabricating a semiconductor device according to claim 1, wherein said insulating layer is formed in the semiconductor layer.

3. A method for fabricating a semiconductor device according to claim 1, wherein the area between the diffused layer having the impurity concentration of less than that of the semiconductor region and the diffused region of the first conductivity type has a diametric dimension at most equal to 1$\mu$.

4. A method for fabricating a semiconductor device according to claim 1, wherein the material of the first mask is different from that of the insulating layer.

5. A method for fabricating a semiconductor device according to claim 1, wherein the first mask consists of $Si_3N_4$ and the insulating layer consists of $SiO_2$.

6. A method of fabricating a semiconductor transistor device comprising the steps of:

providing a collector semiconductor layer of a first conductivity type;

forming a first mask on the surface of a prescribed portion of said semiconductor layer beneath which the base region and the emitter region are to be formed;

diffusing impurities of a second conductivity type opposite said first conductivity type into the exposed surface of said semiconductor layer, thereby forming a first semiconductor region which partially extends beneath said mask and surrounds the portion of said semiconductor layer in which said base region is to be formed;

forming an insulating layer on the entire exposed surface of said semiconductor layer;

etching said first mask thereby exposing the surface of said semiconductor layer surrounded by said first semiconductor region and that portion of said first semiconductor region beneath said first mask;

forming a base region in said exposed portion of said semiconductor layer by diffusing impurities of said second conductivity type into the surface of said semiconductor layer uncovered by the etched first mask, utilizing said insulating layer as a second mask, thereby forming a diffused layer having an impurity concentration less than that of said semiconductor region extending into said surrounded surface portion of said semiconductor layer; and forming an emitter region by diffusing impurities of said first conductivity type into said diffused layer, utilizing said insulating layer as a mask therefor, thereby forming a P-N emitter base junction with the entire upper portion of said base region, the width of which junction is defined by the surrounding first semiconductor region, so that the emitter width is less than the width of said first mask.

7. A method according to claim 6, wherein said step of forming an insulating layer comprises the step of forming said insulating layer in the entire exposed surface of said semiconductor layer to a prescribed depth.

8. A method according to claim 7, wherein the first mask consists of $Si_3N_4$ and the insulating layer consists of $SiO_2$.

References Cited

UNITED STATES PATENTS

| | | | |
|---|---|---|---|
| 3,500,143 | 3/1970 | Lamming | 317—235 R |
| 3,534,234 | 10/1970 | Clevenger | 317—235 R |
| 3,544,858 | 12/1970 | Kooi | 317—235 R |

CHARLES N. LOVELL, Primary Examiner

J. M. DAVIS, Assistant Examiner

U.S. Cl. X.R.

148—188; 317—235